(12) United States Patent
Hearst et al.

(10) Patent No.: US 6,652,649 B1
(45) Date of Patent: Nov. 25, 2003

(54) SUPPLEMENTAL HEATING UNIT FOR CRYSTAL GROWTH FURNACE

(75) Inventors: David T. Hearst, Hermann, MO (US); John Schupp, Kirtland, OH (US)

(73) Assignee: ACT Optics & Engineering, Inc., Mentor, OH (US)

( * ) Notice: Subject to any disclaimer, the term of this patent is extended or adjusted under 35 U.S.C. 154(b) by 157 days.

(21) Appl. No.: 09/884,582

(22) Filed: Jun. 19, 2001

Related U.S. Application Data (63) Continuation-in-part of application No. 09/571,421, filed on May 15, 2000, which is a continuation-in-part of application No. 09/349,597, filed on Jul. 9, 1999, now Pat. No. 6,537,372.

(60) Provisional application No. 60/141,389, filed on Jun. 29, 1999, provisional application No. 60/222,823, filed on Aug. 4, 2000, and provisional application No. 60/245,905, filed on Nov. 3, 2000.

(51) Int. Cl.$^7$ ............................................. C30B 35/00
(52) U.S. Cl. ...................................... 117/200; 117/940
(58) Field of Search .................................. 117/200, 940

(56) References Cited

U.S. PATENT DOCUMENTS

| | | | | |
|---|---|---|---|---|
| 5,454,346 A | * | 10/1995 | Uchida et al. ................ 117/13 |
| 6,146,456 A | * | 11/2000 | Mizugaki et al. ............... 117/2 |
| 6,153,011 A | * | 11/2000 | Pandelisev ................... 117/200 |
| 6,290,773 B1 | * | 9/2001 | Mizuniwa et al. ............ 117/81 |
| 6,309,461 B1 | * | 10/2001 | Gianoulakis et al. ........ 117/206 |
| 6,352,588 B1 | * | 3/2002 | Pandelisev ................... 117/206 |
| 6,402,840 B1 | * | 6/2002 | Pandelisev ................... 117/223 |

* cited by examiner

*Primary Examiner*—Benjamin L. Utech
*Assistant Examiner*—Matthew A. Anderson
(74) *Attorney, Agent, or Firm*—Pearne & Gordon LLP

(57) ABSTRACT

A crystal growth station including a cylindrical crucible having powered bottom and top resistance heaters mounted below and above the crucible, respectively. A supplemental heating unit is positioned around the bottom edge of the crucible. The supplemental heating unit may be unpowered or powered to heat it independently of the top and bottom heaters. If unpowered, then the supplemental heating unit is formed of a cylinder around the lower portion of the crucible side wall and a washer shaped disk member extending under part,of the crucible bottom wall. The supplemental heating unit is generally wedge shaped. The supplemental heating unit is heated by radiation from the bottom heater. The heat is conducted from the disk to the cylinder. A supplemental heater may be similarly used at the top edge of the crucible. If powered, the cylinder and the disk have slits therein to form current paths.

36 Claims, 10 Drawing Sheets

SUPPLEMENTAL HEATING UNIT FOR CRYSTAL GROWTH FURNACE

This a continuation-in-part of Application Ser. No. 09/571,421 filed May 15, 2000 which is a continuation-in-part of Application Ser. No. 09/349,597 filed on Jul. 9, 1999, patented Mar. 25, 2003 as U.S. Pat. No. 6,537,372, which claims priority of provisional Patent Application No. 60/141,389 filed on Jun. 29, 1999. Priority of provisional Patent Application Nos. 60/222,823 and 60/245,905 filed on Aug. 4, 2000 and Nov. 3, 2000 is also claimed.

BACKGROUND OF THE INVENTION

The present invention generally relates to a heater arrangement for a furnace and, more specifically, to a heater arrangement for a crystal growth furnace suitable for producing a high volume of crystals.

Furnaces for the production of crystals, such as single crystals of calcium fluoride, typically have a crucible which is loaded with a seed and/or starting material. A heater (or heaters) is arranged about the crucible to produce a temperature gradient to grow the crystals in the crucible. Growth is obtained by varying power to the heater according to an established power-temperature relationship to obtain the desired thermal environment.

The thermal gradient obtained is critical to growing a single crystal rather than a polycrystalline structures. Additionally, the quality of a single crystal is believed to be primarily affected by the applied thermal gradient. Present furnaces for the production of macrocrystals, therefore, have elaborate and complex heaters and/or controllers for controlling the heaters to obtain the desired thermal environment. These complex devices are expensive to produce and complicated to operate and maintain.

Further, high quality calcium fluoride crystals are of great need in the semiconductor manufacturing industry. Commercial success in growing large, monocrystalline ingots from calcium fluoride, has been limited to ingots have a diameter of 15 inches or less.

In high volume production of crystals it is important to obtain the desired thermal environment and is also important to get consistent temperature environments. In addition, large diameter single-crystal growth requires increased precision and consistency in control of temperature environment. Accordingly, there is a need in the art for a crystal growth furnace which is simple to produce and operate, produces desired thermal environments for growing crystals, and produces consistent thermal environments for growing a high volume of crystals and for growing crystals of a large diameter.

It was found, particularly when growing large crystals in the order of 28" diameters, that the outer circumference of the crystal experienced different temperatures than the central area. As a result, defects could occur in the outer few inches of the circumference of the crystals. Such defects would include small bubbles, reduced height, inclusions, etc.

In order to provide more uniform growth of large crystals, this invention includes a heater extension or supplemental heating unit. It includes a disk that is generally "washer-shaped," having an opening in its center. However, it could be solid and not have a center opening. Dimensions may vary widely depending on the size of the crucible and the primary heater. This disk is located below the bottom heater and above the bottom heater insulation. Whatever the dimensions, the disk should extend beyond the diameters of the bottom heater, crucible and crucible insulation.

The second part of the heater extension or supplemental heating unit is a cylinder connected to or near the disk. The cylinder extends upwardly from the bottom disk to a height which is sufficient to overcome the cooled edge effect.

In all cases, the dimensions and material of the supplemental heating unit may be varied to enhance the main heater's effectiveness in maintaining a constant temperature at the edges of the crucible and the crystal inside of it.

If desired, a nearly identical heater extension could be used on top of the crucible. The upper cylinder would have to be attached firmly to the upper disk by a fastener or adhesive of some type since gravity would be trying to separate them. However, the upper disk could simply be laid on top of the crucible without otherwise fastening it. Alternatively, it could be spaced from the crucible top or top wall.

Alternately, the supplemental heating units could be active heaters. As such, they would have a power source which could be varied to provide more precise control of the heat at the edge of the crucible. In this embodiment, different amounts of power could be supplied to the supplemental disk and cylinder to direct or "vector" heat more upwardly or inwardly depending on the needs of the crystal being grown. This latter feature gives control over crystal growth and cooling not heretofore know. Such a powered supplemental heating unit could be placed at the top and bottom edges of the crucible.

BRIEF SUMMARY OF THE INVENTION

A crystal growth station including a cylindrical crucible having a bottom wall, side wall and top wall. The bottom wall and side wall form a bottom edge. The top wall and side wall form a top edge. A bottom resistance heater is mounted below the crucible to provide heat to the crucible. A top resistance heater is positioned to heat the top of the crucible. At least one power source is attached to the top and bottom heater. A first supplemental heating unit is positioned around the bottom edge of the crucible. The first supplemental heating unit may or may not be supplied with a power source to heat it independently of the top and bottom heaters.

If the first supplemental heating unit is not heated independently, then it is formed of a first cylinder around the lower portion of the crucible side wall. A first disk which is washer shaped is attached to the first cylinder and extends under at least part of the crucible bottom wall. The first supplemental heating unit is, in general, wedge shaped and goes around the bottom edge of the crucible. At the bottom edge, the first supplemental heating unit is heated by radiation from the bottom heater. The heat is conducted from the first disk to the first cylinder. As a heated unit, it holds the temperature of the bottom edge more uniform in a heating and cooling process. A second similar shaped supplemental heater may be used at the top edge of the crucible. The unpowered supplemental heaters may be a solid heat conductive material.

Alternately, the supplemental heating units may be resistance heaters and have independently variable power sources. In this case the first cylinder and the first disk are made of resistance heater material and have slits therein to form current paths. The cylinder and disk will usually be separated from one another and may be independently controllable to balance the heat at the top and/or bottom edge of the crucible and its contents.

The present invention provides a furnace for growing crystals which overcomes at least some of the above-noted problems of the prior art. According to the present invention, a heater arrangement for a crystal growth furnace includes a plurality of individual growth stations each having a crucible. The crystal growth furnace also includes a first heater matrix having at least two resistance heaters electrically connected in series or parallel. Each of the individual growth stations has at least one of the resistance heaters of the first heater matrix associated therewith and located near the crucible. By connecting the resistance heaters of separate growth stations in this manner, the temperatures produced by the resistance heaters in the separate growth stations are fixed at the same temperature for a given power level when the resistance heaters are connected to a single power source.

According to another aspect of the present invention, a heater arrangement for growing crystals includes a plurality of individual growth stations each having a crucible. The heater arrangement also includes a first heater matrix and a second heater matrix separate from the first heater matrix. Each heater matrix preferably includes at least two legs electrically connected in parallel with each of the legs having at least two resistance heaters electrically connected in series. Each of the individual growth stations has at least one of the resistance heaters of the first heater matrix and at least one of the resistance heaters of the second heater matrix associated therewith. By having two separate heater matrices, the temperatures produced by the resistance heaters in a large quantity of separate growth stations can be fixed at the same temperature for a given power level yet the temperature gradient formed in each of the growth stations can be varied when each heater matrix is connected to a separate power source. Preferably, the resistance heaters within the first heater matrix are located above the crucibles and provide a homogeneous temperature across the top of the crucibles and the resistance heaters within the second heater matrix are located below the crucibles and provide a temperature gradient across the bottom of the crucibles.

BRIEF DESCRIPTION OF THE SEVERAL VIEWS OF THE DRAWING

These and further features of the present invention will be apparent with reference to the following description and drawings, wherein.

DETAILED DESCRIPTION OF PREFERRED EMBODIMENTS

Figure 1:
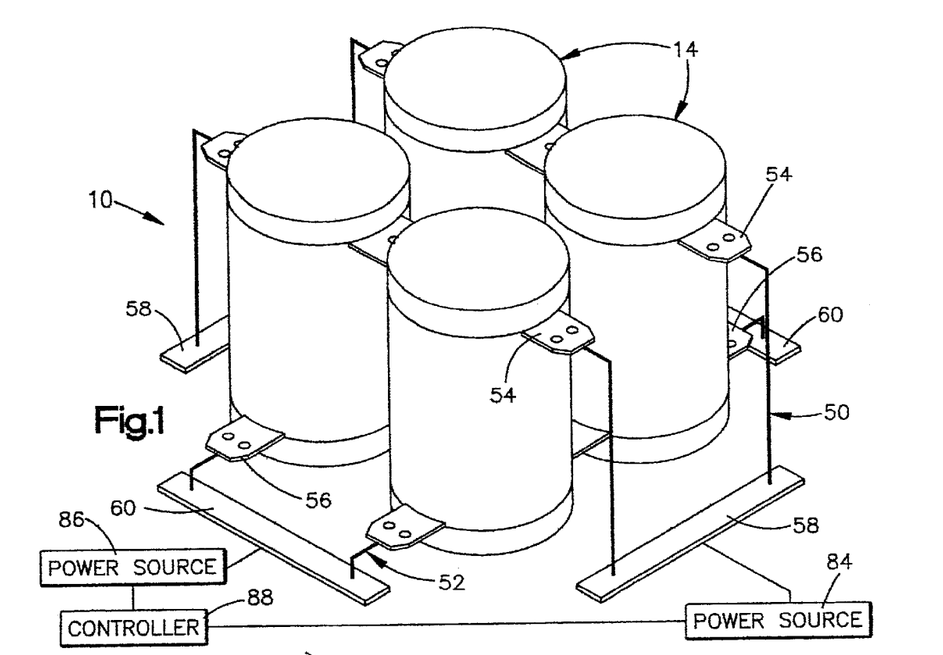
FIG. 1 is a perspective view of a crystal growth furnace having a plurality of individual growth stations for producing a high volume of macrocrystals according to the present invention and with components, such as a vacuum chamber, removed for clarity.

FIG. 1 illustrates a heat treatment or vacuum furnace 10 according to the present invention suitable for growing a high volume of crystals. The crystal growth furnace 10 can be used to grow low and high temperature crystals using, for example, melt, Vapor Phase Epitaxy (including VPE, MVPE and OMVPE), Chemical Vapor Deposition (CVD) and thin film processes. The crystal furnace 10 can be used to grow crystals of a variety of different materials such as calcium fluoride, sodium iodide, and cesium iodide etc. The crystal growth furnace 10 is particularly useful in growing single macrocrystals having diameters of, for example, up to about four feet and larger but can also be used to grow other types of crystals such as microcrystals or polycrystalline structures.

Figure 5:
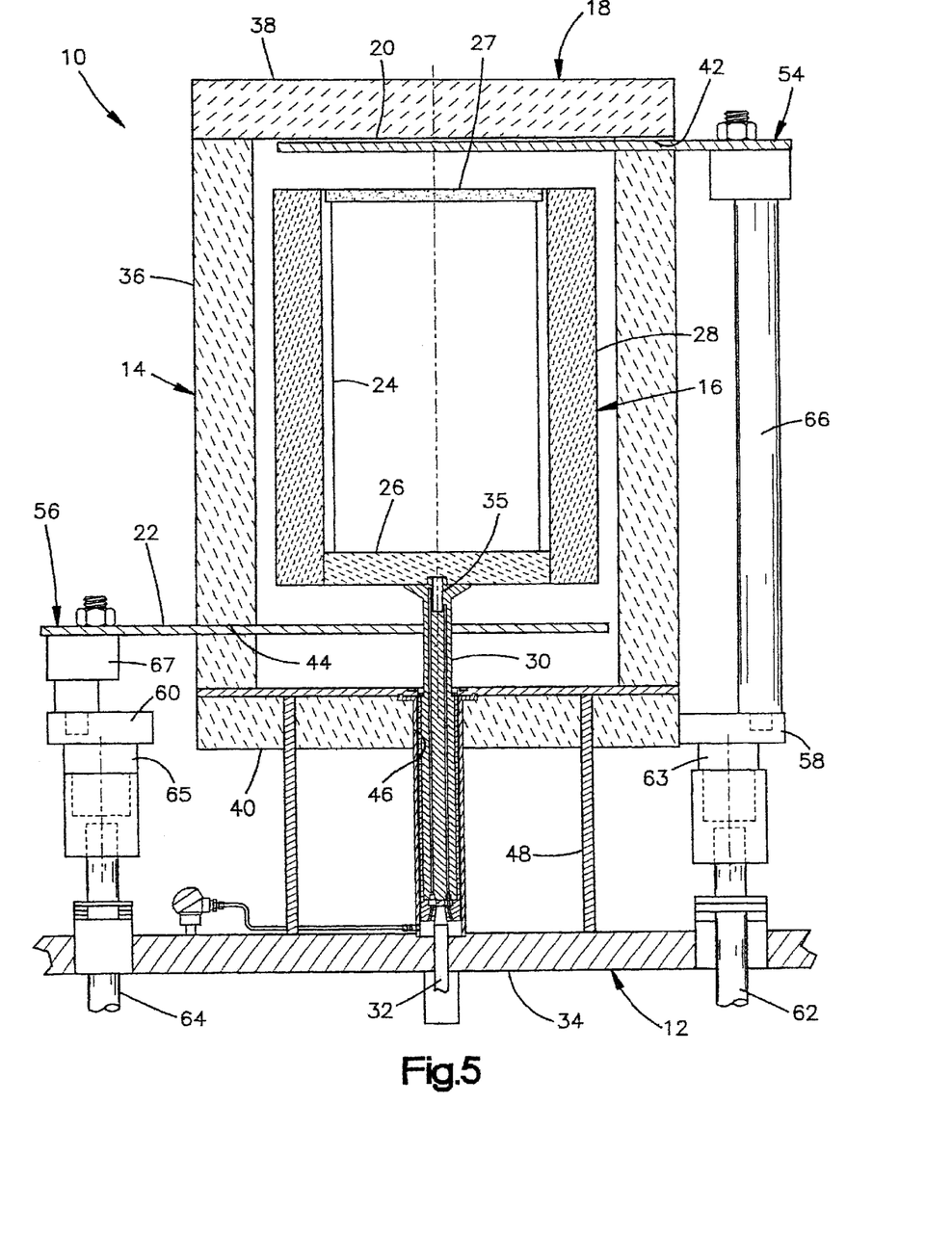
FIG. 5 is an enlarged elevational view, in cross-section, of one crucible of the crystal growth furnace of FIG. 1.

As best shown in FIGS. 1 and 5, the crystal growth furnace 10 includes a water-cooled pressure vessel or vacuum chamber 12 and a plurality of individual growth stations 14 located within the vacuum chamber 12. The vacuum chamber 12 preferably operates at a pressure of 10 millitorr or less. The dimensions of the vacuum chamber 12 depend on the size and number of individual growth stations 14 located therein. In the illustrated embodiment there are four individual growth stations but a greater or lesser number can be utilized as discussed in more detail hereinbelow.

Each individual growth station 14 includes a crucible 16 in which a crystal will grow, an insulating container or cylinder 18 surrounding the crucible 16, and two heaters 20, 22 located within the insulating cylinder 18 and adjacent the crucible 16. Preferably, a top heater 20 is located above the crucible 16 and a bottom heater 22 is located below the crucible 16. It is noted, however, that other heater locations such as around the sides of the crucible 18 are within the scope of the present invention.

The illustrated crucible 16 is cylindrical or cup-shaped having a side wall 24 and a bottom wall 26. The crucible 16 is formed of a suitable material such as, for example, graphite, carbon, or other carbon composites. The dimensions of the crucible 16 depend on the desired size of the crystal to be grown therein. A crucible believed suitable for growing single crystals of calcium fluoride has an outer diameter of about 5.5 inches, an outer height of about 12 inches, an inner diameter of about 4 inches, and an inner height of about 10.75 inches. Suitable ranges for the crucible dimensions are believed to be an outer diameter of from about 2 inches to about 40 inches, an outer height of from about 6 inches to about 40 inches, an inner diameter of from about 1 inch to about 38 inches, and an inner height of from about 3 inches to about 36 inches.

The top opening of the crucible 16 is closed by a lid or cover 27. The lid 27 is formed of a suitable material such as graphite or carbon composite. The lid and top of the side wall and any other appropriate part will be referred to as a top wall 29. The crucible 16 includes a bottom edge 31 formed by the side wall 24 and bottom wall 26. A top edge 33 is formed by the top wall 29 and side wall 24.

The perimeter of the crucible 16 is provided with suitable insulation 28. The insulation 28 comprises a suitable material such as rigidized carbon felt or rigidized carbon foam. The inner surface of the insulation 28 preferably has a thin layer of graphite foil or GRAFOIL for increased reflection of the radiation. This thin layer of graphite foil preferably has a thickness in the range of about $1/32$ inch to about $1/8$ inch. The insulation 28 preferably extends the entire height of the crucible 16 from the top to the bottom of the side wall 24. The insulation 28 preferably extends about 1 to 6 inches from the outer diameter of the crucible side wall 24 but not beyond the outer diameter of the top and bottom heaters 20, 22. Insulation having a thickness of about 1.5 inches is believed suitable for the above described crucible for growing single crystals of calcium fluoride but it may be thicker or thinner depending on the insulation heat transfer characteristics. It is noted that the insulation 28 is located at other locations about the crucible 16 when the heaters 20, 22 heaters have other locations.

The crucible 16 is supported by a pedestal 30 downwardly extending from the bottom wall 26, through the bottom heater 22, and rests in a cup or adapter. The cup rests on a shaft 32 which extends through the base plate or bottom wall 34 of the vacuum chamber 12. The pedestal 30 is formed of a suitable material such as, for example, graphite or carbon composite while the cup is formed of a suitable material such as steel or inconel, and the shaft 32 is formed of a suitable material such, for example, as stainless steel or inconel. The pedestal 30 extends into or otherwise supports the bottom wall 26 of the crucible 16 and is preferably provided with an upward facing recess or pocket 35 for holding a seed or starting material. A pocket having a diameter of about $7/16$ inches, a length of about 1.5 inches and extending into the crucible about 1 inch is believed suitable for the above described crucible to receive starting material for growing single crystals of calcium fluoride. The seed pocket diameters described above are for crystals having diameters up to about 13 inches, crystals having larger diameters should have seeds greater than about 1 inch in diameter.

The insulating cylinder 18 is adapted to generally surround the crucible 16 and the top and bottom heaters 20, 22 so that the top and bottom heaters 20, 22 are insulated from the top and bottom heaters 20, 22 of the other individual growth stations 14 so that each of the individual growth stations 14 will be thermally independent of the others. The illustrated insulating cylinder 18 has a cylindrically-shaped side wall 36, a top wall 38 generally closing the open upper end of the side wall 36, and a bottom wall 40 generally closing the lower open end of the side wall 36. The side, top, and bottom walls 36, 38, 40 comprise suitable insulation material such as rigidized carbon felt or rigidized carbon foam. The insulation material is preferably suitable for maintaining a temperature difference of about 1000° C. to about 1300° C. The side wall 36 is sized so that the top and bottom heaters 20, 22 can reside within the inner diameter of the side wall 36 and is provided with suitable openings 42, 44 for the passage of the top and bottom heaters 20, 22 therethrough. The surface of the inner diameter of the insulating cylinder 18 preferably has a thin layer of graphite foil or GRAFOIL for increased reflection of the radiation and reduced radiation losses. This layer of graphite foil is also preferably located on the inner surfaces of the top and bottom walls 38, 40. This layer preferably has a thickness in the range of about $1/32$ inch to about $1/8$ inch. An insulating cylinder having wall thicknesses of about 2 inches, an inner diameter of about 9 inches, and an interior height of about 16 inches is believed suitable for the above described crucible for growing single crystals of calcium fluoride. Suitable ranges for the insulating cylinder dimensions are believed to be wall thicknesses of from about 2 inches to about 4 inches, an inner diameter of from about 4 inches to about 72 inches, and an interior height of from about 6 inches to about 48 inches.

The bottom wall 40 of the insulating cylinder 18 is provided with a suitable opening 46 for passage of the pedestal 30 therethrough. Preferably, a base 48 is provided which supports the side, top and bottom walls 36, 38, 40 and positions the walls 36, 38, 40 about the crucible 16 and the top and bottom heaters 20, 22.

Figure 2:
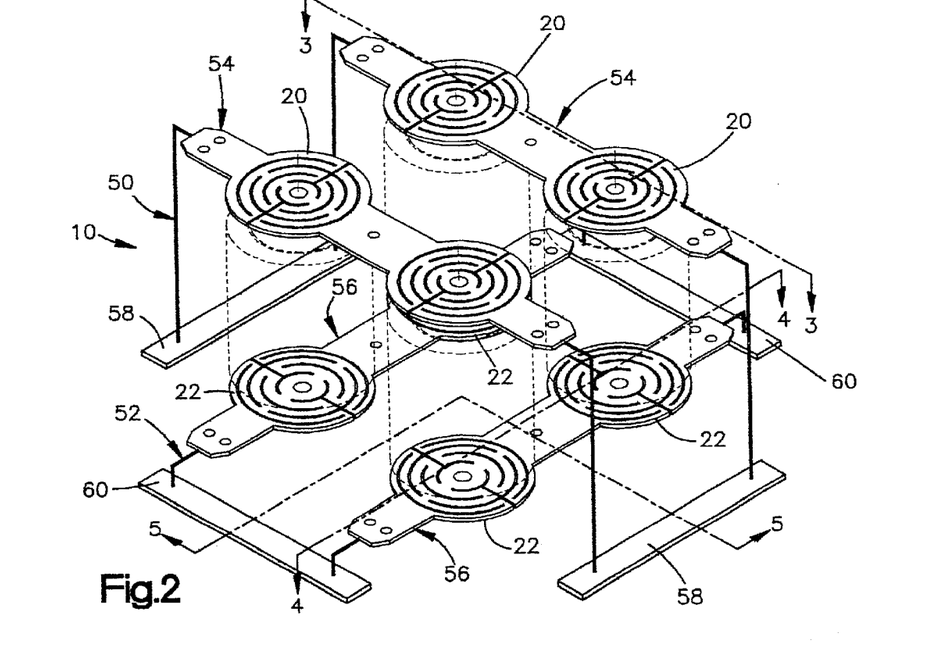
FIG. 2 is a perspective view of the crystal growth furnace of FIG. 1 with further components, such as crucibles, removed for clarity to show a heater matrix.

As best shown in FIG. 2, the top heaters 20 of the individual growth stations 14 are suitably connected to form a top or first heater matrix 50 and the bottom heaters 22 of the individual growth stations 14 are suitably connected to form a bottom or second heater matrix 52. Each heater matrix 50, 52 includes at least one leg 54, 56 of two or more of the heaters 20, 22 connected in series or at least two heater legs 54, 56 which are connected in parallel. Preferably, each heater matrix 50, 52 includes at least two heater legs 54, 56 with each heater leg 54, 56 having at least two heaters 20, 22. The illustrated heater matrices 50, 52 each have two heater legs 54, 56 of two heaters 20, 22 to accommodate the four individual growth stations 14. As noted hereinabove, the number of heater legs 54, 56 and the number of heaters 20, 22 in each heater leg 54, 56 can be greater or lesser depending on the number of individual growth stations 14 desired. Moreover, each heater matrix 50, 52 may be two or more heaters 20, 22 only connected in series, only connected in parallel, or a combination of both.

Power is distributed to the heater matrices 50, 52 by way of bus bars 58, 60. Preferably, the bus bars 58, 60 are all located at the same height near the bottom of the individual growth stations 14. The bus bars 58, 60 are formed of a suitable material such as, for example, graphite or carbon composite. Each heater matrix 50, 52 has a separate pair of the bus bars 58, 60 wherein all of the heater legs 54, 56 of the heater matrix 50, 52 are suitably connected in parallel between the pair of bus bars 58, 60.

As best shown in FIG. 5, the heater legs 54, 56 are connected to the bus bars 58, 60 and the bus bars 58, 60 are connected to copper feed-through electrodes 62, 64 which extend through the bottom wall 34 of the vacuum chamber 12. The bus bars 58, 60 are preferably connected to the copper feed-through electrodes 62, 64 via graphite electrodes 63, 65. Graphite bus bars having a height of about 1 inch, a width of about 4 inches, and a length of about 16 inches are believed to be suitable for a four station furnace having a heater matrix with two legs of two heaters each and the above described crucibles for growing single crystals of calcium fluoride. Suitable ranges for the bus bars are believed to be a height of from about 1 inch to about 5 inches, a width of from about 1 inch to about 5 inches, and a length of from about 6 inches to about 500 inches.

The heater legs 54, 56 are positioned above and below the crucibles 16 and pass through the insulating cylinders 18 via the openings 42, 44. The top heater leg 54 is positioned between and spaced apart from the lid 27 of the crucible 16 and the top wall 38 of the insulating cylinder 18. The bottom heater leg 56 is positioned between and spaced apart from the bottom wall 26 of the crucible 16 and the bottom wall 40 of the insulating cylinder 18. Spacings of about 0.75 inches from the lid 27 of the crucible 16, about 0.5 inches from the top wall 38 of the insulating cylinder 18, about 1.25 inches from the bottom wall 26 of the crucible 16, and about 0.75 inches from the bottom wall 40 of the insulating cylinder 18 are suitable with the above described crucibles for growing single crystals of calcium fluoride. Suitable ranges for the spacings are believed to be from about 0.25 inches to about 1 inch for the distance from the lid 27 of the crucible 16, from about 0.5 inches to about 3 inches for the distance from the top wall 38 of the insulating cylinder 18, from about 0.25 inches to about 1 inch for the distance from the bottom wall 26 of the crucible 16, and from about 0.5 inches to about 3 inches from the bottom wall 40 of the insulating cylinder 18.

In the illustrated embodiment, vertically extending supports or posts 66, 67 are provided between the heater legs 54, 56 and the bus bars 58, 60 at the ends of the heater legs 54, 56. The posts 66, 67 both support the heater legs 54, 56 and electrically connect the heater legs 54 to the bus bars 58, 60. It is noted that the heater legs 54, 56 are preferably self supporting between the posts 66, 67 at the ends of the heater legs 54, 56 but, if necessary, intermediate posts can be utilized. The posts 66, 67 are formed of a suitable material such as, for example, graphite or carbon composite.

The posts 66, 67 are sized to position the heater legs 54, 56 above and below the crucible 16 respectively at their desired heights. A top heater post 66 having a upper portion diameter of about 2 inches, an upper portion length of about 1.5 inches, a lower portion diameter of about 1.5 inches, and a lower portion length of about 15.5 inches is believed to be suitable for a four station furnace having a heater matrix with two legs of two heaters each and the above described crucibles for growing single crystals of calcium fluoride. Suitable ranges for the dimensions of the top heater post 66 are believed to be an upper portion diameter of from about 2 inches to about 6 inches, an upper portion length of from about 1 inch to about 3 inches, a lower portion diameter of from about 1 inch to about 3 inches, and a lower portion length of from about 6 inches to about 20 inches. A bottom heater post 67 having a upper portion diameter of about 2 inches, an upper portion length of about 1.5 inches, a lower portion diameter of about 1.5 inches, and a lower portion length of about 1.25 inches is believed to be suitable for a four station furnace having a heater matrix with two legs of two heaters each and the above described crucibles for growing single crystals of calcium fluoride. Suitable ranges for the dimensions of the bottom heater post 67 are believed to be an upper portion diameter of from about 2 inches to about 6 inches, an upper portion length of from about 1 inch to about 3 inches, a lower portion diameter of from about 1 inch to about 3 inches, and a lower portion length of from about 3 inches to about 12 inches.

Figure 3:
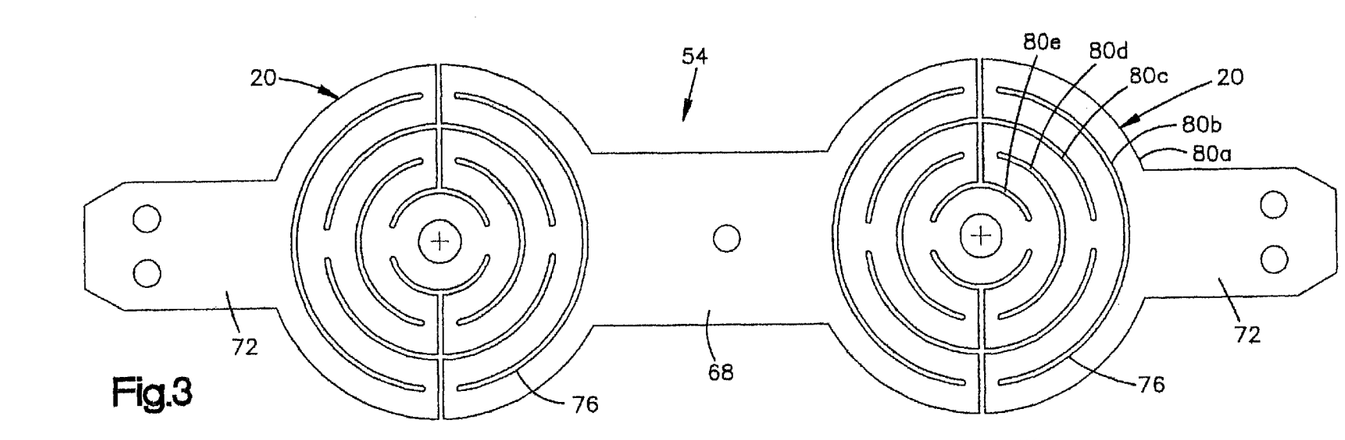
FIG. 3 is a plan view of an upper resistance heater of the arrangement of FIG. 2.
Figure 4:
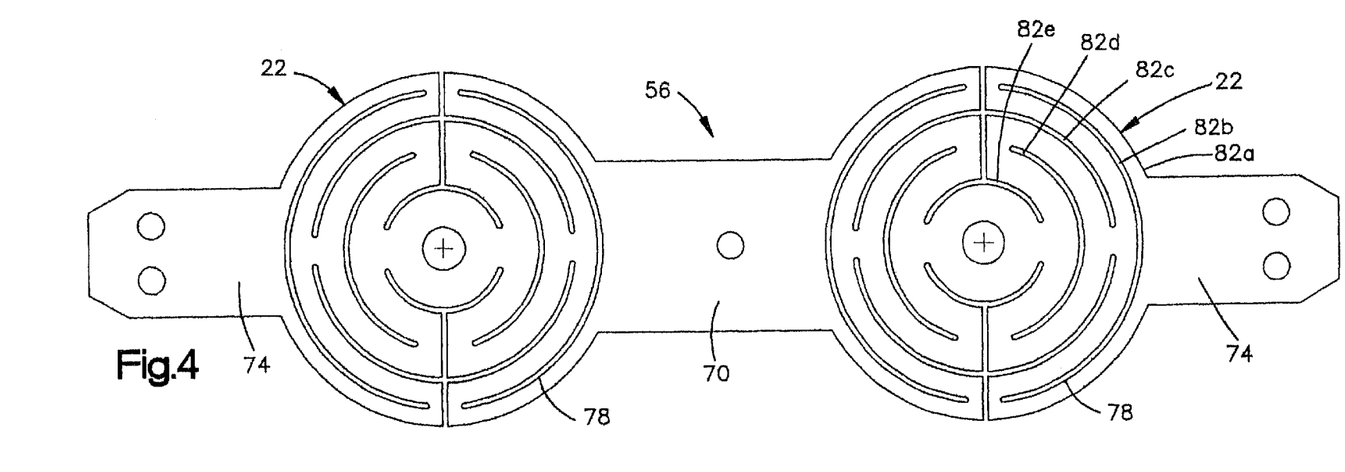
FIG. 4 is a plan view of an lower resistance heater of the arrangement of FIG. 2.

As best shown in FIGS. 3 and 4, the heaters 20, 22 and heater legs 54, 56 are electric resistance heaters and are preferably formed from a single sheet or bar of material. The heater legs 54, 56 preferably comprise graphite or other suitable materials such as, for example, a carbon-carbon composite, a polycarbon composite, or silicon carbide.

In the illustrated embodiment each heater leg 54, 56 has two of the heaters 20, 22 formed therein. Each heater leg preferably has a central portion 68, 70 connecting the heaters 20, 22 and end portions 72, 74 extending from opposite sides of the heaters 20, 22. The end portions 72, 74 are adapted to be connected to the bus bars 58, 60 such as, for example, providing openings for the passage of fasteners therethrough. It is noted that additional or fewer heaters 20, 22 can be formed in a single heater leg 54, 56 as discussed in more detail hereinafter. Graphite heater legs 54, 56 having a thickness of about 5 mm, a total length of about 29.5 inches, heater outer diameters of about 8.25 inches, a central portion length of about 4⅝ inches, end portion lengths of about 4⅛ inches, and central and end portion widths of about 3 to about 5 inches are believed to be suitable for a four station furnace having a heater matrix with two legs of two heaters each and the above described crucibles for growing single crystals of calcium fluoride. Suitable ranges for the dimensions of the heater legs 54, 56 are believed to be a thickness of from about 2 mm to about 18 mm, a total length of from about 8 inches to about 108 inches, heater outer diameters of from about 6 inches to about 40 inches, a central portion length of from about 4 inches to about 10 inches, end portion lengths of from about 4 inches to about 8 inches, and central and end portion widths of from about 2 inches to about 6 inches.

Each heater 20, 22 preferably has body with a generally circular outer periphery and a constant thickness. The body is provided with gaps or slots 76, 78 which produce a "zig-zag" circuit of current flow paths. The flow paths are preferably formed by arcuate or curved circumferentially extending sections 80, 82 connected at their ends. In the illustrated embodiment, there are five sections 80, 82 but a greater or lesser number of sections 80, 82 can be utilized. A first half of the body has two separate current flow paths which extend from the first or outermost section 80a, 82a to the fifth or innermost section 80e, 82e and a second half of the body two separate current flow paths which extend from the innermost section 80a, 82a to the outermost section 80e, 82e. Note that the first and second halves of the body are isolated from one another except at the fifth or inner most section 80a, 82a. Preferably, the two current flow paths are connected along their lengths at intermediate points between the innermost section 80a, 82a to the outermost section 80e, 82e. The current flow paths of illustrated embodiment are connected at the junction between the second sections 80b, 82b and the third sections 80c, 82c and at the junction between the fourth sections 80d, 82d and the fifth sections 80e, 82e.

The heaters 20, 22 within each heater matrix 50, 52 can be the same or different depending on the needs of the crystal growth furnace 10. Each of the heaters 20, 22 within a heater matrix 50, 52 can be the same, that is, have the same resistance such that for any given amperage/voltage, the temperature will be the same at the individual growth stations 14. The heaters 20, 22 within a heater matrix 50, 52 can alternatively each have a different resistance such that for any given amperage/voltage, the temperature will be higher or lower at the various individual growth stations 14. In the illustrated embodiment, each of the top heaters 20 within the top heater matrix 50 are the same and each of the bottom heaters 22 within the bottom heater matrix 52 are the same.

Likewise, the top and bottom heaters 20, 22 of each individual growth station 14 can be the same or different depending on the needs of the growth stations 14. In the illustrated embodiment, the top and bottom heaters 20 within each growth station 14 are different.

As best shown in FIG. 3, each top heater 20 is designed to provide, at any given amperage/voltage, a homogeneous thermal environment across the top of the crucible 16. Accordingly, the sections 80a–80e each have substantially the same width. The dimensions of the top heater 20 depend on the thermal environment desired and the amperage/voltage desired to be supplied. A graphite top heater having a thickness of about 5 mm, an outer diameter of about 8.25 inches, an inner diameter of about 1 inch, gap widths of about ⅛ inch, and section widths of about ⅝ inch is believed to be suitable for the above described crucibles for growing single crystals of calcium fluoride. Such top heaters preferably operate with total power of about 20 kw (for two legs of two heaters) and have a total resistance of about 0.0508 ohms (for two legs of two heaters), therefore there is about 627 amps and 32 volts secondary (going to the bus) and about 85 amps and 240 volts primary (going to the transformer ( step down factor of 2.5)). Other dimensions, resistances, and power will be obvious to one skilled in the art to obtain desired thermal environments.

As best shown in FIG. 4, each bottom heater 22 is designed to provide, at any given amperage/voltage, a radial thermal gradient across the bottom of the crucible, that is, a thermal environment with an increasing temperature in the radial direction, from the center of the crucible 16 to the outer periphery of the crucible 16. The innermost section 82e of the heater 22 is the coldest section and the temperature of each of the sections 82a–82e gradually increases to the outermost section 82a which is the hottest section. This temperature gradient ensures that the origin of the crystal growth will be at one position within the crucible 16 and that location is at the central axis of the crucible 16.

The dimensions of the bottom heater 22 depend on the thermal environment desired and the amperage/voltage desired to be supplied. For a given bottom heater, the width of the outermost current path should be about ½ of the width of the innermost current path. A graphite bottom heater having a thickness of about 5 mm, an outer diameter of about 8.25 inches, an inner diameter of about 1 inch, gap widths of about ⅛ inch, and increasing section widths of about ⅜ inch, about ⅘ inch, about ⅝ inch, about ⅚ inch, and about ⅞ inch is believed to be suitable for the above described crucibles for growing single crystals of calcium fluoride. Such bottom heaters preferably operate with total power of about 20 kw (for two legs of two heaters) and have a total resistance of about 0.06895 ohms (for two legs of two heaters), therefore there is about 540 amps and 37 volts secondary (going to the bus) and about 83 amps and 240 volts primary (going to the transformer (step down factor of 2.5)).

To produce a uniform thermal gradient across the surface of the bottom heater 22, the width of the current flow path 82 at each bend 83 must be carefully selected, depending upon the widths of the two segments of the path 82 that the bend 83 connects. An appropriate value for a bend width, T, has been determined experimentally to be calculated by, $$T = \frac{A+B}{1.79} \cdot \frac{1}{2};$$

where A and B are the widths of the connected paths. Where two bends are involved the calculation becomes, $$T = \frac{A+B}{1.79}.$$

Other dimensions, resistances, and power will be obvious to one skilled in the art to obtain desired thermal environments.

The heaters 20, 22 are constructed of a high strength poly carbon material having a suitable resistance and a tensile strength sufficient to withstand the thermal expansion to support its own weight. One such suitable material is available under the trade name of SIGRIBOND.

As best shown in FIG. 1, the heaters 20, 22 of each heater matrix 50, 52 are connected to a single power source 84, 86 so that at any given power level, the temperature of all the heaters 20, 22 within the heater matrix 50, 52 are fixed and may or may not be the same through out the heater matrix 50, 52 depending on the individual design of the heaters 20, 22. Preferably, the heater matrices 50, 52 each have a separate power source 84, 86. A first power source 84 controls the upper heater matrix 50 and a second power source 86 controls the lower heater matrix 52 so that the temperature of the heater matrices 50, 52 relative to each other can be varied. The separate power sources 84, 86 of the heater matrices 50, 52 are preferably controlled by a single controller 88. The power sources 84, 86 and the controller 88 can be conventional.

Figure 6:
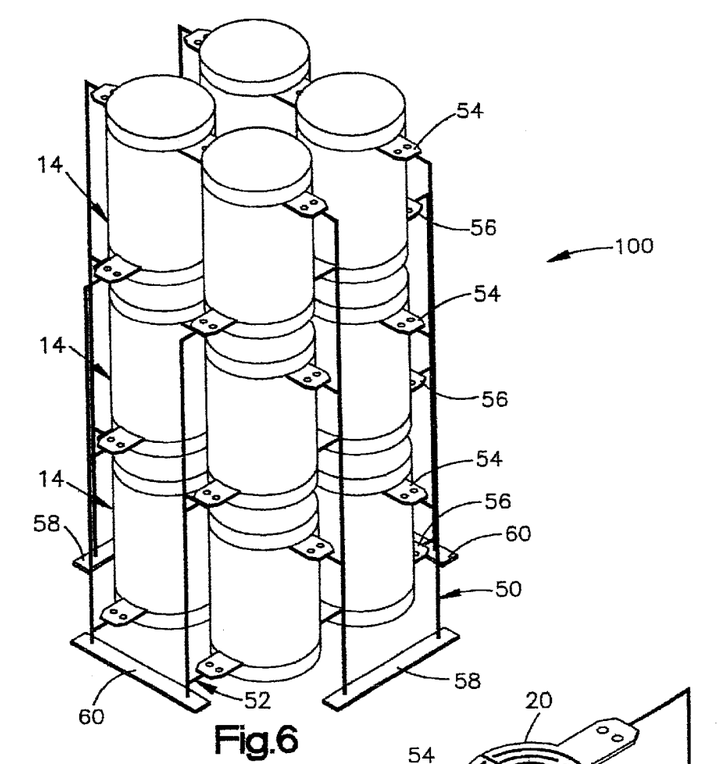
FIG. 6 is a perspective view of a crystal growth furnace having a plurality of individual growth stations for producing a high volume of macrocrystals according to a second embodiment of the present invention with components, such as a vacuum chamber, removed for clarity.

FIG. 6 illustrates a heat treatment or vacuum furnace 100 according to a second embodiment of the present invention wherein like reference numbers are used for like structure. The crystal growth furnace 100 illustrates that additional levels or layers of individual growth stations 14 can be utilized. In the illustrated embodiment there are three levels of four individual growth stations 14 so that the crystal growth furnace 100 has twelve individual growth stations 14. Each heater matrix 50, 52 includes six heater legs 54, 56 connected in parallel with each leg having two heater 20, 22 to accommodate the twelve individual growth stations 14. While the illustrated embodiment has three levels, it is noted that a greater or lesser number of layers can be utilized. It is also noted that the features of the second embodiment can be utilized alone or in combination with each of the features of each of the other disclosed embodiments.

Figure 7:
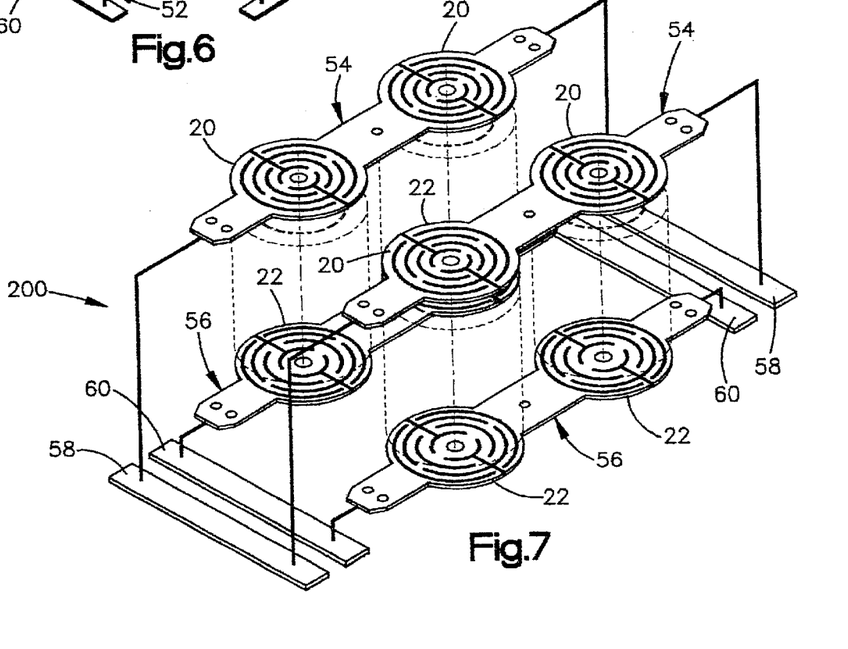
FIG. 7 is a perspective view of a crystal growth furnace having a plurality of individual growth stations for producing a high volume of macrocrystals according to a third embodiment of the present invention with components, such as a vacuum chamber and crucibles, removed for clarity to show a heater matrix.

FIG. 7 illustrates a heat treatment or vacuum furnace 200 according to a third embodiment of the present invention wherein like reference numbers are used for like structure. The crystal growth furnace 200 illustrates that the top heater legs 54 can extend parallel to the bottom heater legs 56 rather than perpendicular as in the first embodiment. Accordingly, the bus bars 58, 60 are parallel on one side rather than perpendicular on different sides as in the first embodiment. In this embodiment the top heater legs 54 have a larger length than the bottom heater legs 56. It is also noted that the features of the third embodiment can be utilized alone or in combination with each of the features of each of the other disclosed embodiments.

Figure 8:
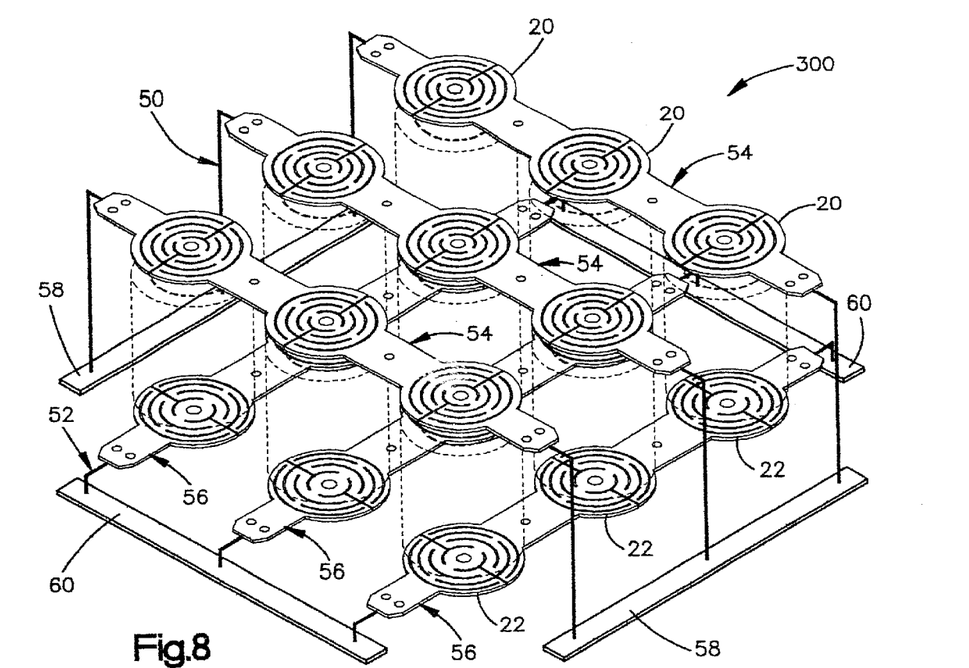
FIG. 8 is a perspective view of a crystal growth furnace having a plurality of individual growth stations for producing a high volume of macrocrystals according to a fourth embodiment of the present invention with components, such as a vacuum chamber and crucibles, removed for clarity to show a heater arrangement.

FIG. 8 illustrates a heat treatment or vacuum furnace 300 according to a fourth embodiment of the present invention wherein like reference numbers are used for like structure. The crystal growth furnace 300 illustrates that there can be additional heater legs 54, 56 and that the heater legs 54, 56 can have addition heaters 20, 22. In the illustrated embodiment, there are three heater legs 54, 56 each having three heaters 20, 22 so that the crystal growth furnace 300 has one level of nine individual growth stations 14. While the illustrated embodiment has one level, three heater legs 54, 56, and three heaters 20, 22 in each heater leg 54, 56, it is noted that a greater number of layers can be utilized a greater or lesser number of heater legs 54, 56 in each layer can be utilized, and a greater of lesser number of heaters 20, 22 in each heater leg 54, 56 can be utilized. It is also noted that the features of the fourth embodiment can be utilized alone or in combination with each of the features of each of the other disclosed embodiments.

It is noted that the fourth embodiment can be particularly advantageous wherein the heaters 20, 22 are different within the heater matrices 50, 52 to form different thermal environments on different individual growth stations 14. This allows the furnace to be utilized to grow crystals using a continuous process technique. In the continuous process technique, material is loaded into containers at one end of the crystal growth furnace 300 and the material passes through a number of individual growth stations 14 having different thermal gradients. For example, the material can pass through individual growth stations 14 which are adapted to separately heat up starting material, grow the crystal, and cool down the crystal to room temperature.

Figure 9:
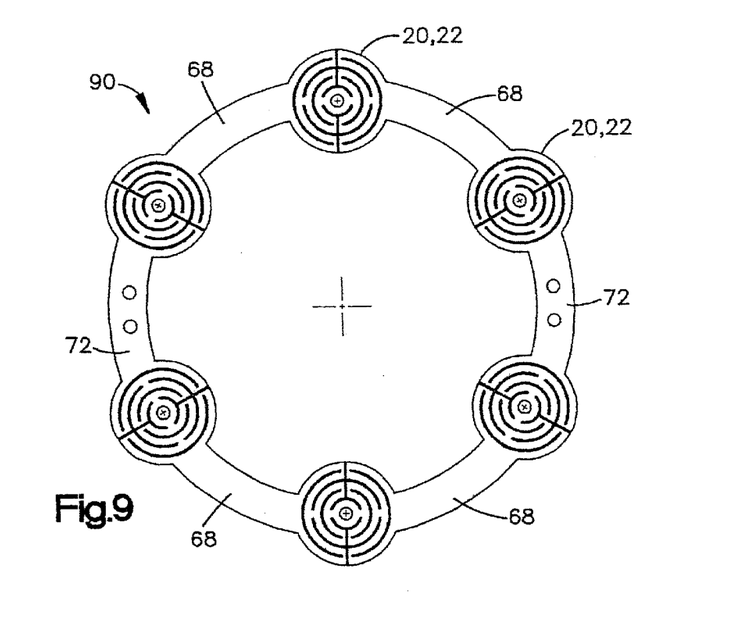
FIG. 9 is a plan view similar to FIGS. 3 and 4 but showing an alternative heater leg.

FIG. 9 illustrates an alternative heater leg 90 wherein like reference numbers are used for like structure. The heater leg 90 illustrates that the heater legs can have shapes other than the above described linear configuration (FIGS. 3 and 4), such as the illustrated circular configuration. In the illustrated embodiment, the heater leg 90 is generally circular and has six of the heaters 20, 22 incorporated therein. It is noted that a greater or lesser quantity of the heaters 20, 22 can be utilized and the heaters 20, 22 can have different locations than illustrated. It is also noted that the alternative heater legs 90 can be utilized alone or in combination with each of the disclosed embodiments. The circular arrangement of the heater leg 90 can be particularly advantageous when a plurality of circular heater legs 90 of various diameters are coaxially arranged.

Figure 10:
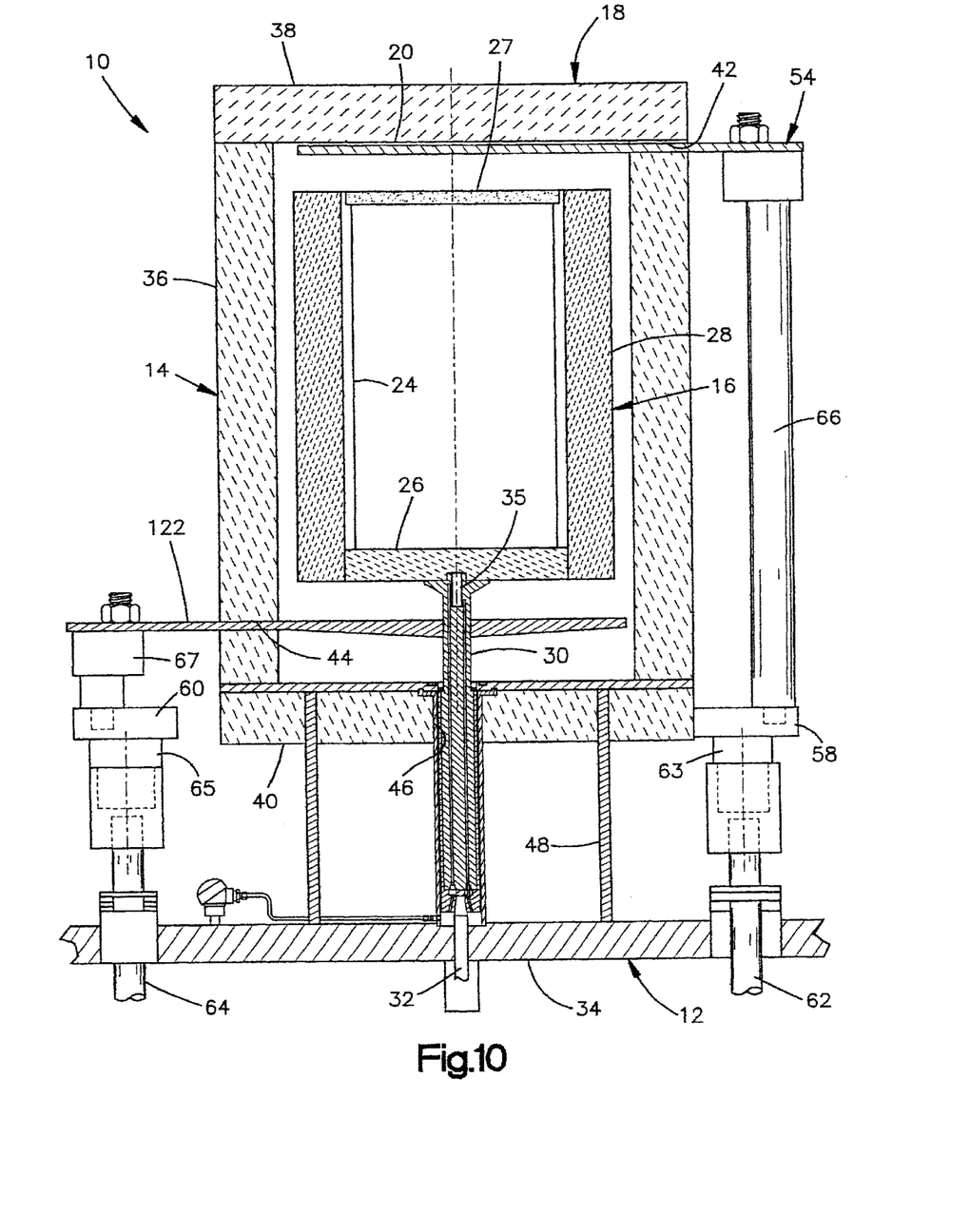
FIG. 10 is an enlarged elevational view, in cross section, similar to FIG. 5 but showing an alternative bottom heater.
Figures 11, 12:
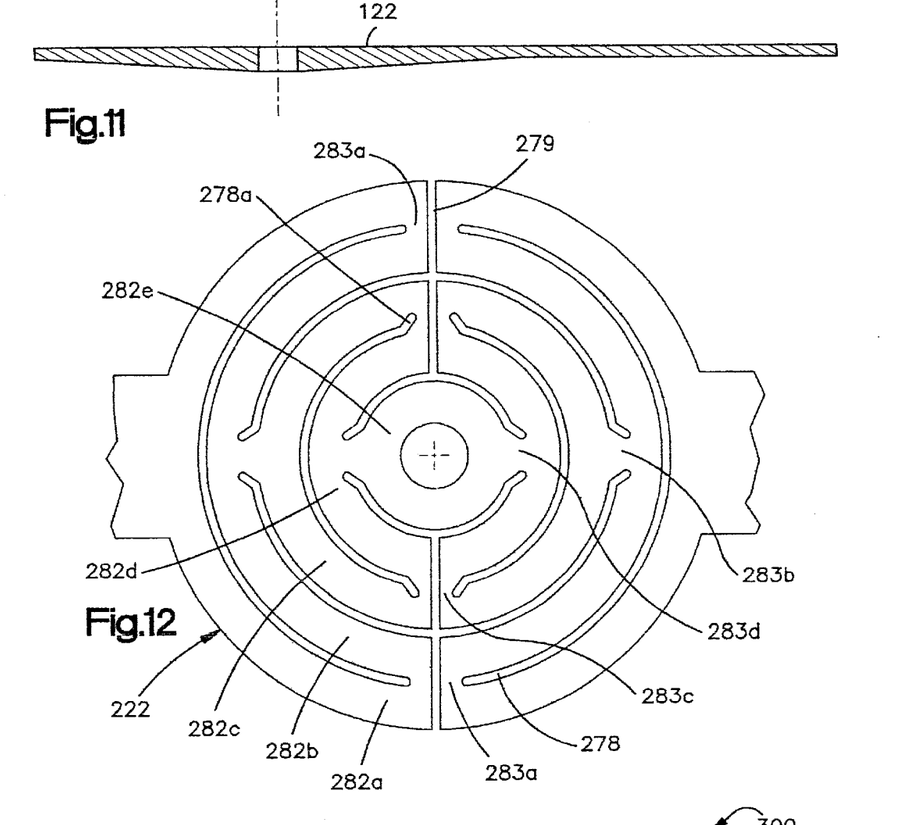
FIG. 11 is a detail of the bottom heater shown in FIG. 10.
FIG. 12 is an plan view showing an alterative bottom heater.

FIGS. 10 and 11 show a sixth embodiment of the bottom heater in which the heater 122 has a variable thickness. In the embodiment of heater 22, an increase in heat output from the center of the heater 22 outward is produced by incrementally decreasing the width of the current path, and thus increasing the electrical resistance. In heater 122, as an alternate method of increasing the resistance of the current path, the thickness of the heater is gradually reduced from the center of the heater outward. The particular thickness used will depend on the characteristics of the thermal gradient desired. This method can be used in place of the variable-width flow path, or the two methods can be used together to allow the heater designer more flexibility in establishing a thermal gradient. It should be noted that, while the method of heater 122 appears to by itself allow for a more evenly sloping resistance, it has a practical limitation. In varying the thickness of the heater 122, the center path becomes the thickest part. If it becomes too heavy, it may flex the heater and potentially cause a fracture or break.

FIG. 12 shows, as a seventh embodiment, an alternate heater design 222 for growing significantly larger crystals. Like bottom heater 22 shown in FIG. 4, this heater 222 is designed to provide a thermal gradient across the radius of the heater 222. Although the thermal gradient produced by the bottom heater 22 is sufficient to inhibit multiple point initiation of crystal growth in crystals 15 inches or less in diameter, growing larger single-crystal ingots requires a more precise thermal gradient. Inherent to the design of the heaters 20, 22, & 222 is the production of cold spots in regions where the current flow path greatly increases in size, especially at bends 83 in the current flow path. As one of ordinary skill in the art will appreciate, current always takes the path of least resistance. Thus, as the current flow path 82a–82e of the heater 22 broadens at the bends 83 (see FIG. 4), the current tends to flow more readily at the inside of the bends 83 producing cold spots toward the outside of the bends 83. If these cold spots are transferred to the crucible 16, undesirable crystal growth may be initiated at the point of transfer.

As shown by FIG. 12, current flow paths 282, being defined by slots 278, are divided into segments 282a, 282b, 282c, 282d and 282e that are connected by bends 283a, 283b, 283c and 283d. To mitigate the problem of cold spots around the bends 283a–283d, the heater 222 has been provided with slot extensions 278a at each bend 283b, 283c and 283d. The slot extensions 278a force the current to flow toward the outside of the slot extensions at the bends 283b–283d, thus reducing the presence of cold spots on the heater 222. As an alternative, two or more slot extensions could be provided to a single bend.

Figure 13:
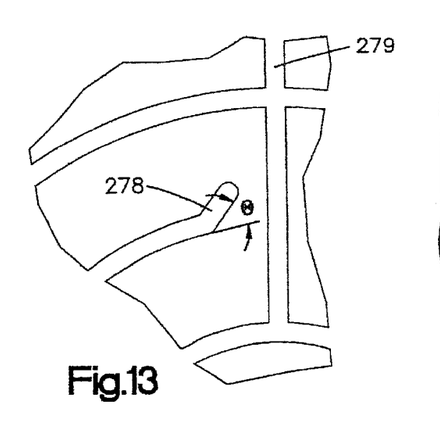
FIG. 13 is a detail of a portion of the bottom heater of FIG. 12.

Referring to FIG. 13, in this seventh embodiment each slot extension 278a is positioned at an angle θ from a line perpendicular to the bisecting slot 279, the angle θ being about 45 degrees for the optimal effect in reducing cold spots. Although the slot extensions 278a may not completely eliminate cold spots from appearing on the bottom heater 222, due to the superior heat conductivity of the crucible 16, any remaining cold spots are "washed out", or greatly reduced, during the heat transfer from the bottom heater 222 to the crucible 16. As a result, any remaining cold spots on the bottom heater 222 will not substantially appear on the bottom of the crucible 16.

The extensions 278a are dimensioned to maintain the width, T, of the bends 283a as calculated above. Further, the slot extensions 278a are not used on the outermost bend 283a in the present heater design because it would weaken the current path 282 too much and may cause the heater 222 to break when handled. However, if a particular heater design were to possess adequate strength, then slot extensions could be used at all of the bends.

In addition to bottom heater design, selecting heaters having an appropriate diameter is also crucial to large single-crystal growth in the 20 to 30 inch range. A specific example is illustrated as follows for growing a single calcium fluoride crystal with a diameter of 28 inches. To allow for shrinkage due to cooling, the inside diameter of the crucible should be determined by a factor of approximately 1.035. Thus, a crucible with an inside diameter of 29 inches is selected for this example. The wall thickness of the crucible should be determined from the inside diameter by a factor of 0.035. In this example, the wall thickness will be 1 inch. Thus, the outside diameter of the crucible will be 31 inches.

In order to insure the side wall of the crucible gets hot enough to suppress crystal growth initiation, the heaters should have a diameter that is no less than 1.2 times as great as the outside diameter of the crucible, the preferred ratio being 1.3. Continuing the above example, the diameter of the heaters used for a crucible with an outside diameter of 31 inches should be 40 inches. The top heater will have the same diameter as the bottom heater 28.

To establish a uniform horizontal gradient across the bottom heater, and thus across the bottom of the crucible, the number of current paths and the width of each must be carefully selected. The ΔT across the bottom heater should be between 12 and 15° C./inch from the center to the outside edge. This should result in a ΔT of between 5.5 and 7.5° C./inch across the bottom of the inside of the crucible. This range should insure large single-crystal sections across the grown ingot while minimizing the strain birefringence and homogeneity index of the ingot. If the ΔT is below this range, the single-crystal sections will diminish in size, and if the ΔT is above this range, the strain birefringence and homogeneity will be too high.

The number of circumferential current paths required on the bottom heater is dependent upon the diameter of the heater and the material used to construct the heater. The following chart has been compiled for determining the number of current paths for a heater constructed of SIGRI-BOND carbon and producing a thermal gradient having a ΔT of approximately 12.5° C./inch.

| Diameter (inches) | Current Paths |
|---|---|
| 15–27 | 3 |
| 28–40 | 5 |
| 41–53 | 7 |
| 54–66 | 9 |

Figure 14:
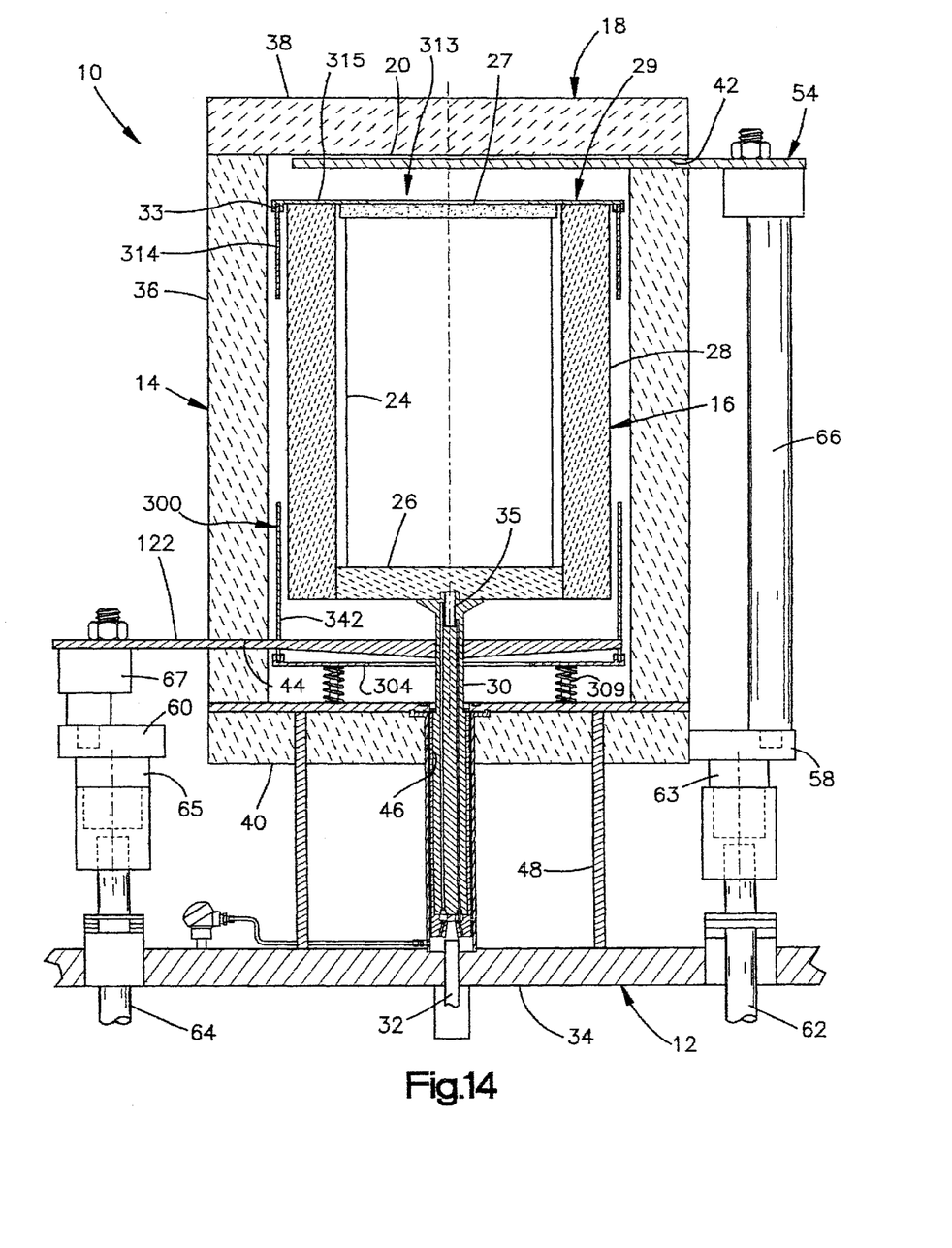
FIG. 14 is a cross-sectional plan view of a crystal growing station with a passive supplemental heating unit.
Figure 14A:
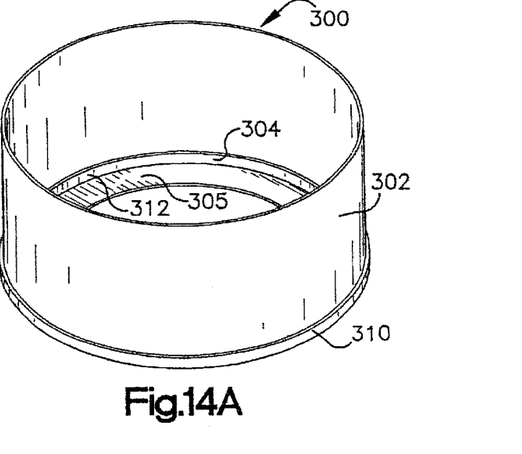
FIG. 14A is a perspective view of the passive supplemental heating unit.

FIGS. 14 and 14A illustrate an alternate embodiment of the crystal growth stations illustrated in FIGS. 5 and 10. The same numerals are used to indicate identical parts. A first supplemental heating unit 300 includes a first cylinder 302 and a first disk 304. As used herein supplemental heating unit means the passive heater of FIGS. 14 and 14A and the active heater of FIGS. 15 and 15A. In FIGS. 14 and 14A, a first cylinder 302 surrounds the lower portion of the crucible 16. The height of the cylinder should be at least about 1" to 3" higher than the height of melted crystal material. The first cylinder 302 is made of a heat conductive material such as graphite or carbon-carbon as usually ¼ to ½" thick. An example of this height would be about 4" to 6" for a $CAF_2$ crystal having about a 3" thickness. In one example, the cylinder would be spaced from the crucible insulation 28 between 0.5" and 4.0" and from the heater insulation 36 between 0.5" and 3.0". The first cylinder 302 is at least partially located between the crucible insulation 28 and the heater insulation 36.

The first disk 304 is located under the primary bottom heater 122 and connects with the first disk 302. The disk is generally "washer" shaped but other shapes are possible. The size will vary widely depending on the size of the crucible. In one instance, a crucible having about a 28" internal diameter will have a disk with an inner diameter 304 about 5" less than the outer diameter of the bottom heater and will extend radially outwardly to about 5" greater than the outer diameter of the bottom heater.

The disk 304 may be supported in many ways known to one skilled in the art. The design shown in FIG. 14 uses a plurality of threaded rods 309 extending upwardly from the bottom insulation. The thickness of the disk 304 will vary but will generally be ¼" to ⅜" and made of graphite, carbon-carbon or other heat conductive material.

The disk must be positioned close enough to the primary heater in order to receive sufficient heat radiation to rise to about the same temperature. Usually that spacing will be about 0.5" to 0.75". The distance between the disk and the bottom insulation is about 0.5" to 1.0". The disk should also be highly heat conductive.

The cylinder may be fastened to the disk in any known manner that will conduct heat. For example, a circular groove the width of the cylinder wall may be molded or cut into the disk 0.75" from the outer diameter. Fasteners could also be used.

It is important that heat is transferred efficiently from the disk to the cylinder. One structure to enhance the heat transfer are cylindrical rings 310 and 312 on either side of the groove in the disk. These cylindrical rings 310 and 312 (FIG. 14A) may be cemented to the disk or otherwise attached. They may have about a 1" height and be the same thickness as the cylinder. The cylinder would be positioned between the rings and have its surfaces contacting them. Heat transfer from the disk to the cylinder would thereby be enhanced.

A second supplemental heating unit 313 is substantially the same as the first supplemental heating unit 300. A second cylinder 314 is connected to a second disk 315 in a similar manner as the bottom supplemental heater 302. The second or top supplemental heater may either lay on the top wall 29 or be suspended above it.

Both of the supplemental heating units generally receive heat from the primary heaters at the disks and conduct it to the cylinders. In this way, the edges 31 and 33 are more uniformly heated and cooled resulting in higher quality crystals with less defects.

Figure 15:
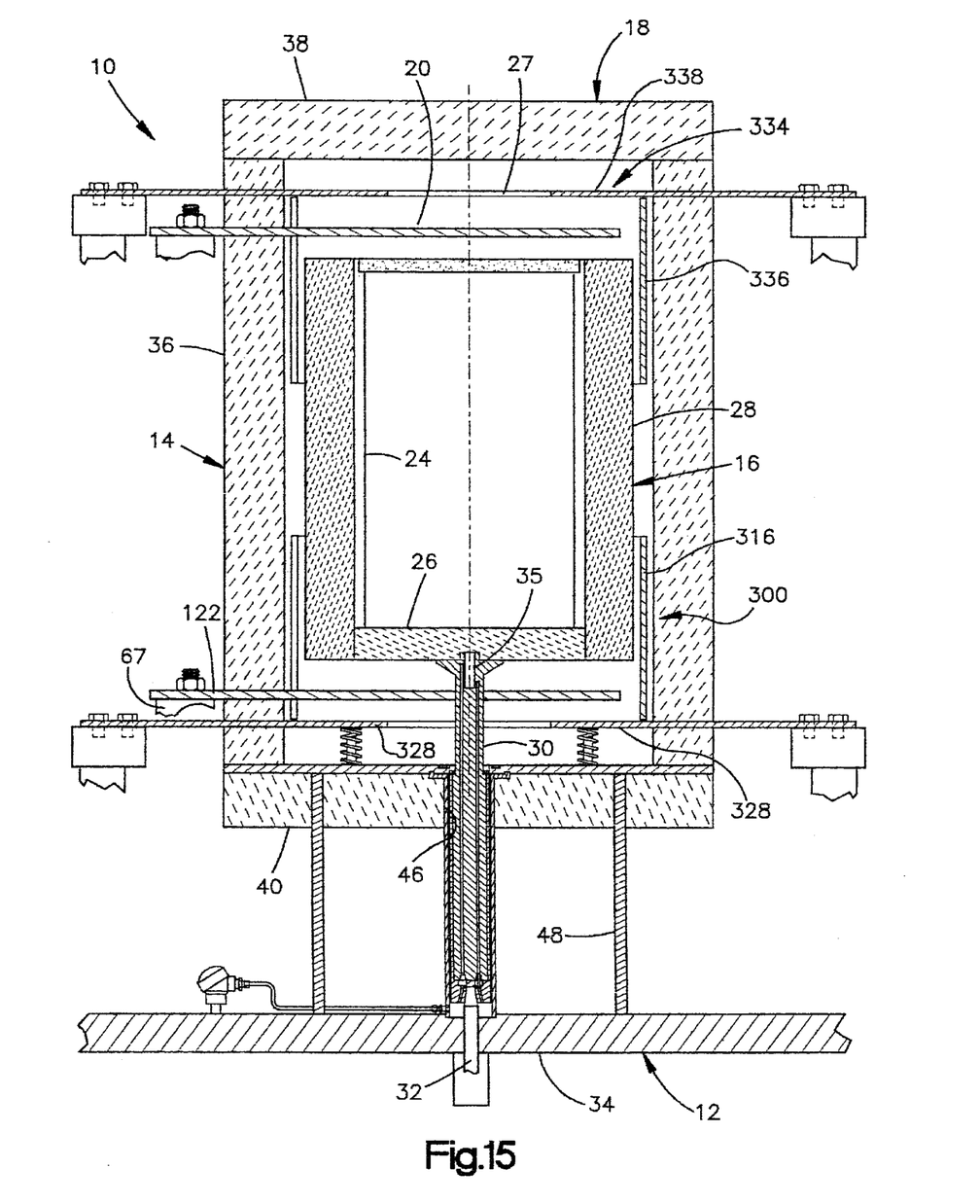
FIG. 15 is a cross-sectional plan view of the crystal growing station with an active supplemental heating unit.
Figure 15A:
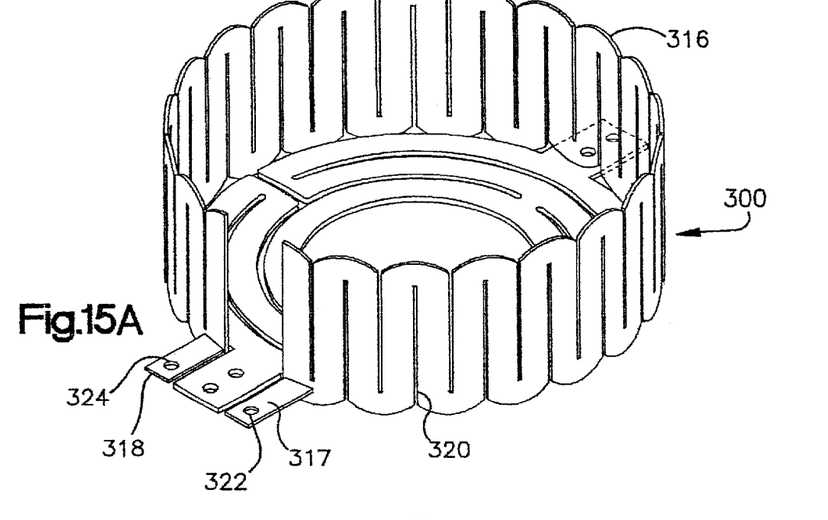
FIGS. 15A and 15B are perspective views of the active supplemental heating unit.
Figure 15B:
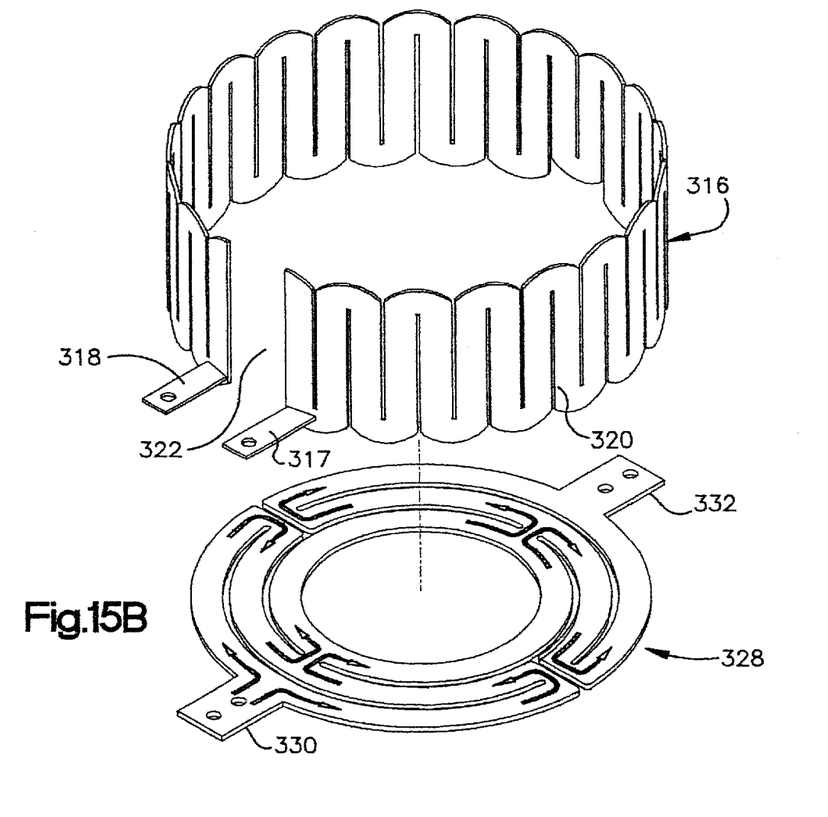

While the primary bottom heater 122 is shown having a varying thickness, it can and often does a constant thickness such as shown in FIG. 5. FIGS. 15, 15A and 15B illustrate an embodiment of this invention which includes a supplemental heating unit 300 that is actively powered and heated. The power to the supplemental unit may be the same or different from the amount of power supplied to the primary heaters. The same numerals are used to indicate identical parts as in previously described embodiments. The active supplemental heating unit includes an actively heated first cylinder 316. It is made of heat conductive material such as graphite, carbon-carbon, etc. that heats when eleectrical current passes through it. The first cylinder has connectors 317, 318 for connection to a power source. The cylinder 316 includes a series of slits 320 in alternating directions in order to form a continuous electrical pathways to heat the actively heated first cylinder 316 evenly. A gap 322 is shown between the connectors 317, 318. However, this gap 328 should be minimized to allow space for the first actively heated disk 328 and its connector 330 or eliminated to make the distribution of heat around the crucible as evenly as possible. The powered first cylinder can have various thickness and spacing of the slits to create different desired temperatures. In one embodiment for growing 28" crystals, the thickness of the cylinder is about ¼" thick and the spacing of the slits are about 1" apart. Holes 322 and 324 are provided to bolt the cylinder 314 to a bus bar or other suitable power source.

The actively heated first disk 328 includes connectors 330, 332 with holes therein for connecting to a bus bar. At least one power source provides a current to one of the connectors 330 or 332. Current flows from one connector say 330 in twin paths as shown in FIG. 15B. The relative position of the first disk 328 and first cylinder 314 is illustrated in FIGS. 15 and 15A.

The heated first cylinder is located between the crucible side wall 24 with its insulation 28 and the side wall insulation 36. In the example of a 28" inner diameter of the crucible, the height of the actively heated first cylinder will be 1" to 3" taller than the melted crystal. The heated first disk will have a diameter that is about 5" to 7" less than the outer diameter of the bottom heater 122. The first disk 328 extends radially outwardly to about 5" to 7" greater than the outer diameter of the bottom heater 122. These differences will vary depending on the temperatures desired, size of heaters, size of crucible, etc. The first disk 328 is located below the primary bottom heater and above the bottom layer of insulation. Typically, the distance between the first disk 328 and the bottom layer of insulation will be in the area of 0.25" to 2.0". The distance between the first disk 328 and the bottom heater will also be about 0.25" to 2.0".

Moreover, the spacing between the insulation 28 and the heated first disk 316 will be about 0.5" to 3.0" in this example. There will be similar distances between the heated first disk 316 and the insulation 36.

If desired a second healed supplemental heating unit 334 can be used around the top edge of the crucible. The components and spacings will be substantially the same as the active first supplemental heating unit. An actively heated second cylinder 336 and an actively heated second disk 338 are spaced from each other to prevent shorting. They may be powered by a single power source and a common bus bar or separate power sources can be utilized to heat the cylinders and/or disks differently. In this manner more or less radially and/or axially directed heat could be utilized to satisfy the unique needs of any crystal being heated or cooled.

Although particular embodiments of the invention have been described in detail, it will be understood that the invention is not limited correspondingly in scope, but includes all changes and modifications coming within the spirit and terms of the claims appended hereto.

The times and temperatures associated with the annealing and cooling cycles used to grow a particular crystal will depend upon the materials used, the overall size and the quality of the crystal to be grown. Although particular embodiments of the invention have been described in detail, it will be understood that the invention is not limited correspondingly in scope, but includes all changes and modifications coming within the spirit and terms of the claims appended hereto.

What is claimed is:

1. A crystal growth station comprising a crucible having a bottom wall, side wall and top wall;
   a bottom edge formed by the bottom wall and the side wall and a top edge formed by the top and the side wall;
   a bottom heater positioned below the bottom wall to provide heat to the crucible;
   a top heater positioned above the top wall to heat the top of the crucible;
   a power source for the top and bottom heater;
   a first supplemental heating unit at the bottom edge of the crucible extending along at least part of the side wall of the crucible.

2. The crystal growth station of claim 1 wherein the first supplemental heating unit extends radially across at least part of the bottom wall and partially up the side wall.

3. The crystal growth station of claim 1 wherein the crucible is cylindrical in shape and the first supplemental heating unit includes a first cylindrical wall extending around the crucible side wall.

4. The crystal growth station of claim 3 wherein the first supplemental heating unit further includes a first disk at least part of which is below the crucible bottom wall, the first disk being connected to the first cylindrical wall.

5. The crystal growth station of claim 4 wherein the first supplemental heating unit has a pair of cylindrical rings mounted near the edge of the first disk, the spacing of the rings being matched to hold the supplemental heating unit first cylinder and the first disk having an opening at its center.

6. The crystal growth station of claim 4 wherein the first disk and cylinder are placed in close proximity to the bottom heater to enhance more uniform heat transfer to edges of the crucible and nearby areas of the crucible than without the first supplemental hearing unit in order to aid in growing more uniform crystals.

7. The crystal growth station of claim 4 wherein the second supplemental heating unit includes a second cylindrical wall extending around the crucible side wall near its top.

8. The crystal growth station of claim 7 wherein the second supplemental heating unit further includes a second disk on or near the cover, the disk being connected to the second cylindrical wall at or near its edge so that the second supplemental heating unit fits around the top edge of the crucible thus distributing heat at the top edge more evenly than without the first and second supplemental heating.

9. The crystal growth station of claim 4 wherein the bottom heater is a resistance heater comprising a sheet of resistance material cut to define electrical flow paths having resistances for obtaining desired predetermined thermal environments.

10. The crystal growth station of claim 3 wherein there is wall insulation between the crucible wall and the first supplemental heating cylinder and there is bottom insulation between the crucible bottom wall and the bottom heater.

11. The crystal growth station of claim 10 wherein the outside diameter of the first disk extends beyond the wall insulation on the side wall of the crucible.

12. The crystal growth station of claim 10 wherein the cylinder of the supplemental heating unit extends upwardly to a height 1" to 3" taller than the height of melted crystal material when the crucible is used.

13. The crystal growth station of claim 1 which further includes a second supplemental heating unit at the top of the crucible.

14. The crystal growth station of claim 13 wherein the second supplemental heating unit includes a second cylindrical wall extending around crucible side wall near its top.

15. The crystal growth station of claim 14 wherein the second supplemental heating unit further includes a second disk on or near the cover, the disk being connected to the second cylindrical wall at or near its edge so that the second supplemental heating unit fits around the top edge of the crucible thus distributing heat at the top edge more evenly than without the first and second supplemental heating units.

16. A crystal growth furnace comprising a plurality of individual growth stations, each crystal growth station comprising a crucible having a bottom wall, side wall and top wall to form a closed container;
   a bottom edge formed by the bottom wall and the side wall and a top edge formed by the top wall and the side wall;
   a heater matrix including at least one matrix leg, each leg including at least two resistance heaters electrically connected in series or parallel, each of the individual growth stations having at least one of the resistance heaters associated therewith and located near the crucible; and
   a supplemental heating unit at the top or bottom edge of the crucible to provide more uniform heat to the top or bottom edge of the crucible than without the supplemental heating unit.

17. The crystal growth furnace of claim 16 wherein the supplemental heating unit includes a cylindrical wall extending around the crucible side wall and a disk connected to the cylindrical side wall, at least part of the disk extending in close proximity to the top or bottom wall so that heat can be transferred more evenly to the top or bottom edges of each crucible than without the supplemental heating unit.

18. The crystal growth station of claim 16 which further includes a second actively heated supplemental heating unit positioned at the top edge of the crucible and a power source for heating said second actively heated supplemental heating unit.

19. The crystal growth station of claim 18 wherein the second actively heated supplemental heating unit includes a second cylindrical wall extending around the crucible side wall near its top.

20. A crystal growth station comprising a crucible having a bottom wall, side wall and top wall to form a closed container;

a bottom edge formed by the bottom wall and the side wall and a top ledge formed by the top wall and on the side wall;

a bottom heater positioned below the bottom wall to provide heat to the crucible;

a top heater positioned to provide heat the top of the crucible;

at least one power source for the top and bottom heater;

a first actively heated supplemental heating unit at the bottom edge of the crucible extending along at least part of the side wall of het crucible; and said at least one power source connected to the first supplemental heating unit to heat it.

21. The crystal growth station of claim 20 wherein the actively heated first supplemental heating unit extends radially across at least part of the bottom wall and up the side wall.

22. The crystal growth station of claim 21 wherein the bottom heater is a resistance heater comprising a sheet of resistance material slit to define electrical flow paths having resistances for obtaining predetermined thermal environments.

23. The crystal growth station of claim 20 wherein the crucible is cylindrical in shape and the first supplemental heating unit includes a first cylindrical wall extending around the crucible side wall near the bottom.

24. The crystal growth station of claim 20 wherein the actively heated first supplemental heating unit further includes a first disk at least part of which is below the crucible bottom wall.

25. The crystal growth station of claim 24 wherein the first cylindrical wall is a resistance type heater.

26. The crystal growth station of claim 25 wherein the resistance type heater has a series of slits in it so that a current pathway is formed around the first cylindrical wall thus heating it and the crucible side wall.

27. The crystal growth station of claim 26 wherein the first disk has an opening at its center and a series of slits so that a current pathway is formed across the first disk thus heating it and the crucible bottom wall.

28. The crystal growth station of claim 27 wherein the first cylindrical wall and the first disk are insulated from each other.

29. The crystal growth station of claim 27 wherein the second actively heated supplemental heating unit further includes a disk on or near the top wall so that the second actively heated supplemental heating unit fits around the top edge of the crucible thus aiding in distributing heat at the top edge more evenly than without the second actively heater supplemental heating unit.

30. The crystal growth station of claim 29 wherein the second cylindrical wall and second cylindrical disk are made of a resistance material slit cut to define electrical flow paths having resistances for obtaining predetermined thermal environments.

31. The crystal growth station of claim 25 wherein there is side insulation between the crucible side wall and the first supplemental heating cylinder and there is bottom insulation between the crucible bottom wall and the bottom heater.

32. The crystal growth station of claim 31 wherein the outside diameter of the first disk extends beyond the insulation on the side wall of the crucible.

33. The crystal growth station of claim 20 which further includes a second actively heated supplemental heating unit including a second cylindrical wall extending around crucible side wall near its top.

34. The crystal growth station of claim 33 wherein the second actively heated supplemental heating unit further includes a second disk positioned near the top wall so that the second supplemental heating unit fits around the top edge of the crucible thus distributing heat at the top edge more evenly than without the second actively heated supplemental heating unit.

35. A crystal growth furnace comprising a plurality of individual growth stations, each crystal growth station comprising a crucible having a bottom wall, side wall and top wall to form a closed container;

a bottom edge formed by the bottom wall and the side wall and a top edge formed by the top wall and the side wall;

a heater matrix including at least one matrix leg, each leg including at least two resistance heaters electrically connected in series or parallel, each of the individual growth stations having at least one of the resistance heaters associated therewith and located near the crucible;

an actively heated supplemental heating unit at the top or bottom edge of the crucible to provide more uniform heat the top or bottom edge of the crucible than without the heated supplemental unit;

a power source for the supplemental heating unit.

36. The crystal growth station of claim 35 wherein the supplemental heating unit is a resistance type heater having slits therein to define a current path.

* * * * *